United States Patent
Sapone et al.

(10) Patent No.: US 8,489,054 B2
(45) Date of Patent: Jul. 16, 2013

(54) MILLIMETER WAVE OSCILLATOR

(75) Inventors: Giuseppina Sapone, Aci Catena (IT); Alessandro Italia, Solarino (IT); Egidio Ragonese, Aci Catena (IT); Giuseppe Palmisano, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 298 days.

(21) Appl. No.: 13/049,689

(22) Filed: Mar. 16, 2011

(65) Prior Publication Data

US 2011/0230155 A1    Sep. 22, 2011

(30) Foreign Application Priority Data

Mar. 16, 2010   (IT) .............................. MI2010A0418

(51) Int. Cl.
*H04B 1/26* (2006.01)

(52) U.S. Cl.
CPC ...................................... *H04B 1/26* (2013.01)
USPC ...................... 455/260; 455/316; 331/117 FE

(58) Field of Classification Search
CPC ........................................................ H04B 1/26
USPC ................. 455/208, 255, 256, 258, 259, 260, 455/264, 307, 313, 315, 316, 317, 318; 331/25, 331/117 R, 117 FE, 177
See application file for complete search history.

(56) References Cited

U.S. PATENT DOCUMENTS

| | | | |
|---|---|---|---|
| 5,025,229 A | 6/1991 | Hasegawa et al. | |
| 6,064,872 A | 5/2000 | Vice | |
| 7,098,747 B2 * | 8/2006 | Anand | 455/260 |
| 2005/0270114 A1 | 12/2005 | Hino | |
| 2006/0097811 A1 | 5/2006 | Nakamura et al. | |
| 2006/0255873 A1 | 11/2006 | Kobayashi | |
| 2008/0197894 A1 * | 8/2008 | Jang et al. | 327/118 |
| 2011/0241789 A1 * | 10/2011 | Chang et al. | 331/117 FE |

FOREIGN PATENT DOCUMENTS

| | | |
|---|---|---|
| JP | 2001-68930 A | 3/2001 |
| JP | 2001-689830 A | 3/2001 |
| WO | 01/93491 A2 | 12/2001 |

OTHER PUBLICATIONS

Li, H. et al., "Millimeter-Wave VCOs With Wide Tuning Range and Low Phase Noise, Fully Integrated in a SiGe Bipolar Production Technology," IEEE Journal of Solid-State Circuits 38(2):184-191, Feb. 2003.

Nicolson, S. T. et al., "Design and Scaling of W-Band SiGe BiCMOS VCOs," IEEE Journal of Solid-State Circuits 42 (9):1821-1833, Sep. 2007.

* cited by examiner

*Primary Examiner* — Thanh Le
(74) *Attorney, Agent, or Firm* — Seed IP Law Group PLLC

(57) ABSTRACT

An oscillator is described, comprising at least one transistor having a first terminal connected to a power supply voltage. The oscillator comprises at least one inductive element connected to a second terminal of the transistor and to a bias voltage and at least one capacitive element coupled between a third terminal of the transistor and ground. The oscillator further comprises means to collect the output signal of the oscillator on the second terminal of the transistor. The oscillator is of the millimeter wave type, i.e., both the inductive element and the capacitive element are sized such that the oscillation frequency is between 30 and 300 gigahertz.

20 Claims, 6 Drawing Sheets

MILLIMETER WAVE OSCILLATOR

BACKGROUND

1. Technical Field

The present disclosure relates to an oscillator, in particular to an oscillator operating at millimeter wave frequencies.

2. Description of the Related Art

The use of VCOs (Voltage-Controlled Oscillators) is known in the state of the art, especially in wireless telecommunications systems; said oscillators are mainly used within phase locked loops or PLLs to implement the fundamental synthesis function of the reference carrier. Designing oscillators is particularly difficult due to the ever increasing number of applications which exploit a carrier with frequencies of the order of 100 GHz, close to the transition frequencies of the most advanced technological processes on silicon.

A VCO based on an inductor-capacitor (LC) resonator is mainly used in integrated circuits for wireless radiofrequency applications, as such an oscillator is capable of providing high spectral purity while being capable of limiting consumptions. The Colpitts circuit based on an LC series resonator is a circuit topology mainly used in high frequency applications (generally higher than a few tens of GHzs); the resonator of said circuit has a lower parasitic load.

However, the Colpitts oscillator has some drawbacks. Indeed, the use of modern bipolar technologies with the miniaturization of the transistors reduces the breakdown voltages, with a consequential lowering of the power supply voltages; this results in a limitation of the amplitude and dynamics of the signals which may be generated.

The resonator quality factor in the range of millimeter waves is mainly determined by the performance of the components which provide the variable capacitance. These elements are often implemented by means of varactors, consisting of diodes or metal-oxide semiconductor transistors (MOSs). Such varactors degrade the phase noise of the VCO both due to the worsening of the same quality factor thereof, and due to the conversion of the AM-PM noise due to the non-linear voltage/capacitance feature. Using varactor elements of minimum size ensures the best performances of the device in terms of quality factor and linearity. The parasitic capacitances are needed to be reduced for maximizing the obtainable calibration range of the variable capacitance or tuning range. The tuning range specifications are highly stringent if related to the dimension of the usable varactors, as not only the variation of the reference frequency is to be ensured within the operating band, but there is a need to compensate the frequency drifts due to thermal, environmental and/or process variations.

Some voltage-controlled oscillators have a circuit configuration of differential type which has different advantages especially at high frequency, i.e., the high common mode rejection of the disturbances and the increased robustness with respect to the parasitic inductive ground and power paths on the chip or also by means of the connections made with wires. FIG. 1 shows a typical Colpitts oscillator for applications with millimeter waves. The oscillator in FIG. 1 comprises two npn bipolar transistors Q1 and Q2 having the emitter terminals connected in parallel to a series of two variable capacitors C2 and a series of two inductors Le; the common terminal of the two inductors is connected to a reference current Iee while a voltage Vtune is applied to the common terminal of the two variable capacitors C2. The series of two inductors Lb, the common terminal of which is connected to a bias voltage Vb, is arranged between the base terminals of the two transistors Q1 and Q2. There is a capacitor C1 which includes the intrinsic base-emitter capacitance Cbe and a possible external capacitance, between the emitter and base terminals of each of the transistors Q1 and Q2. The collector terminals of transistors Q1 and Q2 are connected to the power supply voltage Vcc by means of two inductors Lc; the output voltage Vo is between the collector terminals.

There is a capacitive series impedance with negative real part from the base terminals of each of the transistors Q1 and Q2. The presence of the inductive element Lb determines a resonance at the frequency $$F_0 = \frac{1}{2\pi\sqrt{Lb\frac{C1C2}{C1+C2}}},$$

and the oscillation is triggered if the negative impedance is able to compensate for the circuit leakages. The capacitors C2 are adjusted by means of the control voltage Vtune and determine the tuning range of the oscillator. The inductance Le offers high impedance between the emitter terminals at the oscillation frequency and further provides a decoupling of the variable capacitors C2 with respect to the parasitic capacitances of the current source Iee, thus preserving the tuning range. The impedance due to the element Lc on the collector provides a load by means of which the signal is provided towards the transmission/reception buffers and/or towards the dividers. An inductor Le2 may be inserted between the emitter terminal of transistors Q1 and Q2 and the inductors Le, which improves the tuning range features. Indeed, the series network consisting of the components Le2 and C2 is sized so as to offer capacitive impedance with improved performance of the quality factor and tuning range with respect to variable capacitors C2 only. In this case the quick variation of the equivalent capacitive impedance of the series consisting of components Le2 and C2 is exploited to increase the tuning range, as well as the increased quality factor due to the resonance approaching.

The greatest drawback of the oscillator in FIG. 1 is the presence of the Miller effect on the capacitance C1, i.e., the intrinsic capacitance between collector and base, of the transistors Q1 and Q2 due to the finite voltage gain between base terminals and collector. An equivalent capacitance $C_M$ of comparable or even higher value to/than the capacitors C1 and C2 is on the base terminal of each of the transistors Q1 and Q2. The capacitance $C_M$ is a fixed capacitive component parallel to the inductor Lb which introduces a severe limitation on the tuning range in applications having millimeter waves. The capacitance $C_M$ reduces the equivalent negative resistance of the active circuit, thus worsening the start-up condition. The load impedance Lc causes a signal to develop on the collector terminals at the oscillation frequency; the oscillation which develops on the base terminal is repeated on the emitter terminal and on the collector terminal with an opposite sign. The active-area operation for each transistor Q1, Q2 is ensured if $v_{b,max} - v_{c,min} < Vcc - Vb + Vbe - Vce,sat$, where $v_{b,max}$ and $v_{c,min}$ are the maximum signal voltage on the base and the minimum signal voltage on the collector, respectively, while the voltage Vbe is the bias voltage between the base terminals and emitter, and the voltage Vce,sat is the collector-emitter saturation voltage. Reduced output dynamics may limit the phase noise performances obtainable from the oscillator. The presence of the capacitance $C_M$ reduces the isolation between the collector terminal output and the resonator. A lesser isolation causes an increased influence of the load circuit on the impedance of the resonator.

Collecting the output signal from the collector terminals is not a substantial advantage at millimeter wave frequencies, as the current gain between collector and base under conditions of oscillation is usually less than one.

A cascode stage may be introduced in the circuit in FIG. 1, i.e., a stage of two npn bipolar transistors Q3 and Q4 having the emitter terminals connected with the collector terminals of the transistors Q1 and Q2, the collector terminals connected with the terminals of the inductors Lc and the base terminals connected to a bias voltage Vb1, as seen in FIG. 2. Introducing a cascode buffer in the circuit in FIG. 1 allows the capacitance $C_M$ not to be subjected to amplification due to the low input impedance of the common base stage, but there is a significant dynamics limitation introduced by the cascode configuration, as better described in the article by H. Li and H.-M. Rein, "Millimeter-Wave VCOs With Wide Tuning Range and Low Phase Noise, Fully Integrated in a SiGe Bipolar Production Technology," *IEEE J. Solid-State Circuits*, vol. 38, pp. 184-191, February 2003. Such a solution is not advantageous if used on modern technological bipolar processes and/or CMOSs having a power supply voltage significantly less than 3V.

FIG. 3 illustrates a topology of a Colpitts VCO in which the capacitances Cn were inserted between the base terminal of transistor Q1 and the collector terminal of transistor Q2, and between the base terminal of transistor Q2 and the collector terminal of transistor Q1; thereby there is a compensation for the base-collector capacitance, as described in the article by S. T. Nicolson, et. al., "Design and Scaling of W-Band SiGe BiCMOS VCOs," *IEEE J. Solid-State Circuits*, vol. 42, pp. 1821-1833, September 2007. However, the amplitude limits remain because of the bipolar saturation depending on the configuration with load on the collector.

BRIEF SUMMARY

One embodiment of the present disclosure provides an oscillator which overcomes the aforesaid drawbacks.

In particular, the oscillator provides a non-saturated increased dynamics of the transistor which allows a greater oscillation amplitude with improved phase noise. In the case of oscillator with variable capacitor in accordance with the disclosure, there is an improved tuning range due to the smaller existing parasitic capacitances and a reduction of power consumption, performance being equal in terms of tuning range and phase noise.

One embodiment the present disclosure is an oscillator comprising at least one transistor having a first terminal connected to a power supply voltage, the oscillator comprising at least one inductive element connected to a second terminal of the transistor and to a bias voltage, and at least one capacitive element coupled between a third terminal of the transistor and ground, characterized in that it comprises means for collecting the output signal of said oscillator on the second terminal of the transistor.

BRIEF DESCRIPTION OF THE SEVERAL VIEWS OF THE DRAWINGS

The features and advantages of the present disclosure will become apparent from the following detailed description of practical embodiments thereof, shown by way of non-limiting example in the accompanying drawings, in which.

DETAILED DESCRIPTION

Figure 1:
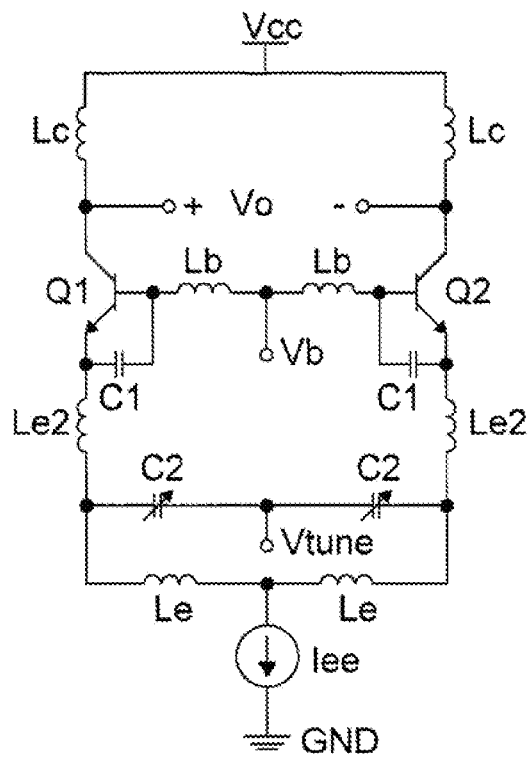
FIG. 1 is a circuit diagram of a voltage-controlled oscillator in accordance with the known art.
Figure 2:
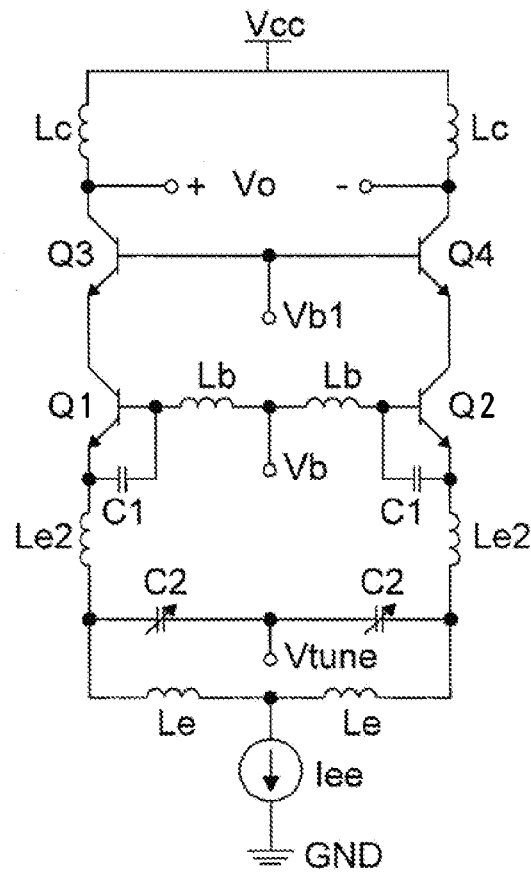
FIG. 2 is another circuit diagram of a voltage-controlled oscillator in accordance with the known art.
Figure 3:
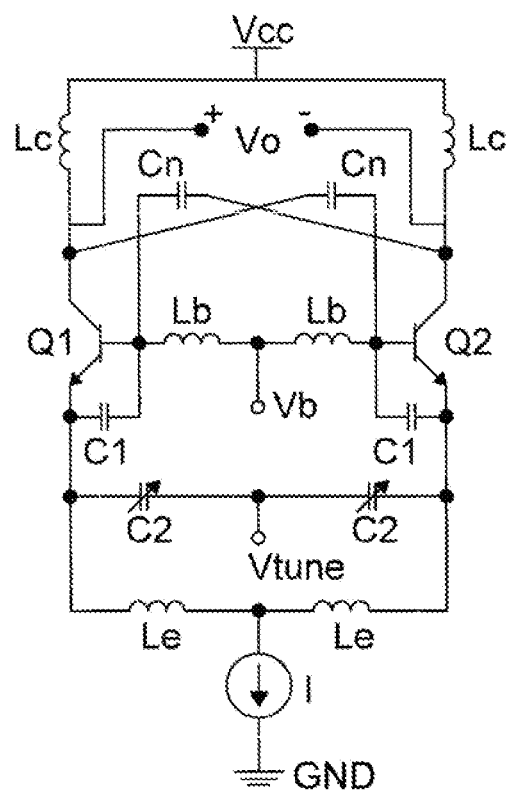
FIG. 3 is a further circuit diagram of a voltage-controlled oscillator in accordance with the known art.
Figure 4:
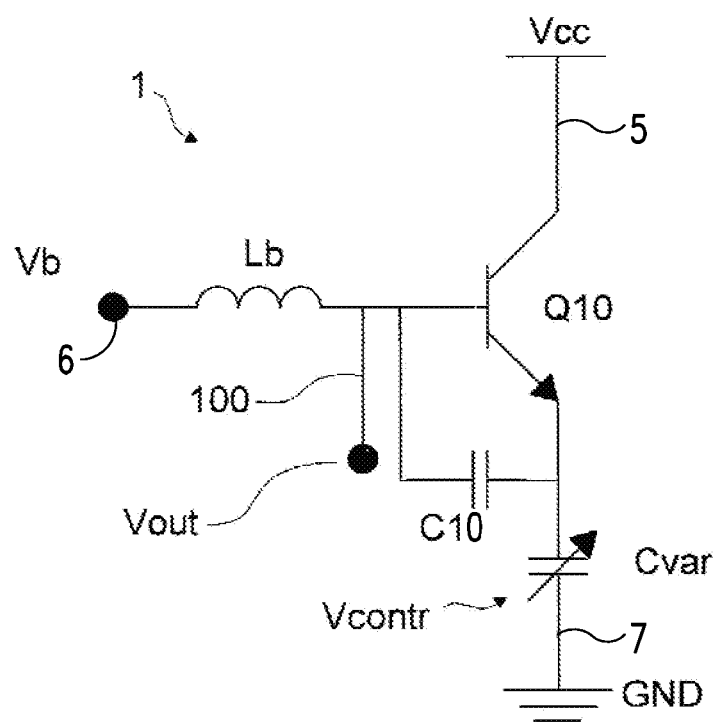
FIG. 4 is a circuit diagram of an oscillator in accordance with a first embodiment of the present disclosure.

With reference to FIG. 4, an oscillator 1 is shown in accordance with a first embodiment of the present disclosure. Oscillator 1 has a structure based on a Colpitts circuit. The oscillator comprising at least one transistor Q10; the transistor Q10 may be a bipolar transistor (preferably an npn bipolar transistor) or a MOS transistor (preferably an NMOS transistor). The transistor Q10 has a first terminal, i.e., the collector terminal in the case of a bipolar transistor or the drain terminal in the case of a MOS transistor, connected to a power supply voltage terminal 5 configured to receive a power supply voltage Vcc. The oscillator comprises at least one inductive element Lb connected to a second terminal of the transistor Q10, i.e., the base terminal in the case of a bipolar transistor or the gate terminal in the case of a MOS transistor, and to a bias voltage terminal configured to receive a bias voltage Vb and a capacitive element Cvar coupled between a third terminal of the transistor, i.e., the emitter terminal in the case of a bipolar transistor or the source terminal in the case of a MOS transistor, and a voltage reference terminal 7 configured to be coupled to ground GND.

The transistor Q10 has a capacitive element C10 arranged between the second and third terminals; said capacitive element may be the sole parasitic capacitance intrinsically present between the second and third terminals of the transistor Q10, i.e., the base-emitter capacitance in the case of bipolar transistor or the gate-source capacitance in the case of MOS transistor, or a set of said parasitic capacitance and another external capacitance.

Preferably, the capacitive element Cvar is a variable capacitance controlled by an external voltage signal Vcontr.

Oscillator 1 comprises an output terminal 100 for collecting the output signal Vout of said oscillator; said terminal 100 is directly connected to the second terminal of the transistor Q10. Thereby, the load impedance on the collector terminals and/or the use of current buffers are eliminated and therefore both the dynamics limitations and the Miller effect of the capacitance $C_\mu$ are avoided, i.e., the base-collector capacitance in the case of bipolar transistor or the gate-drain capacitance in the case of MOS transistor, which is deleterious for the tuning range performances and for starting up the oscillator.

The oscillator in FIG. 4 is of the millimeter wave type, i.e., both the inductive element Lb and the capacitive element Cvar are sized such that the oscillation frequency is between 30 and 300 gigahertz. In the case of a transistor operating at millimeter wave frequencies, the current gain between the first terminal and the second terminal under conditions of oscillation is usually less than one. This depends on the intrinsic structure of the transistor, indeed the current technology for the MOS or bipolar transistors at the operating frequencies typical of millimeter waves rarely allows to obtain a unit or greater gain of one from the base or gate terminal and the collector or drain terminal under conditions of oscillation, i.e., in the presence of ample signal.

Figure 5:
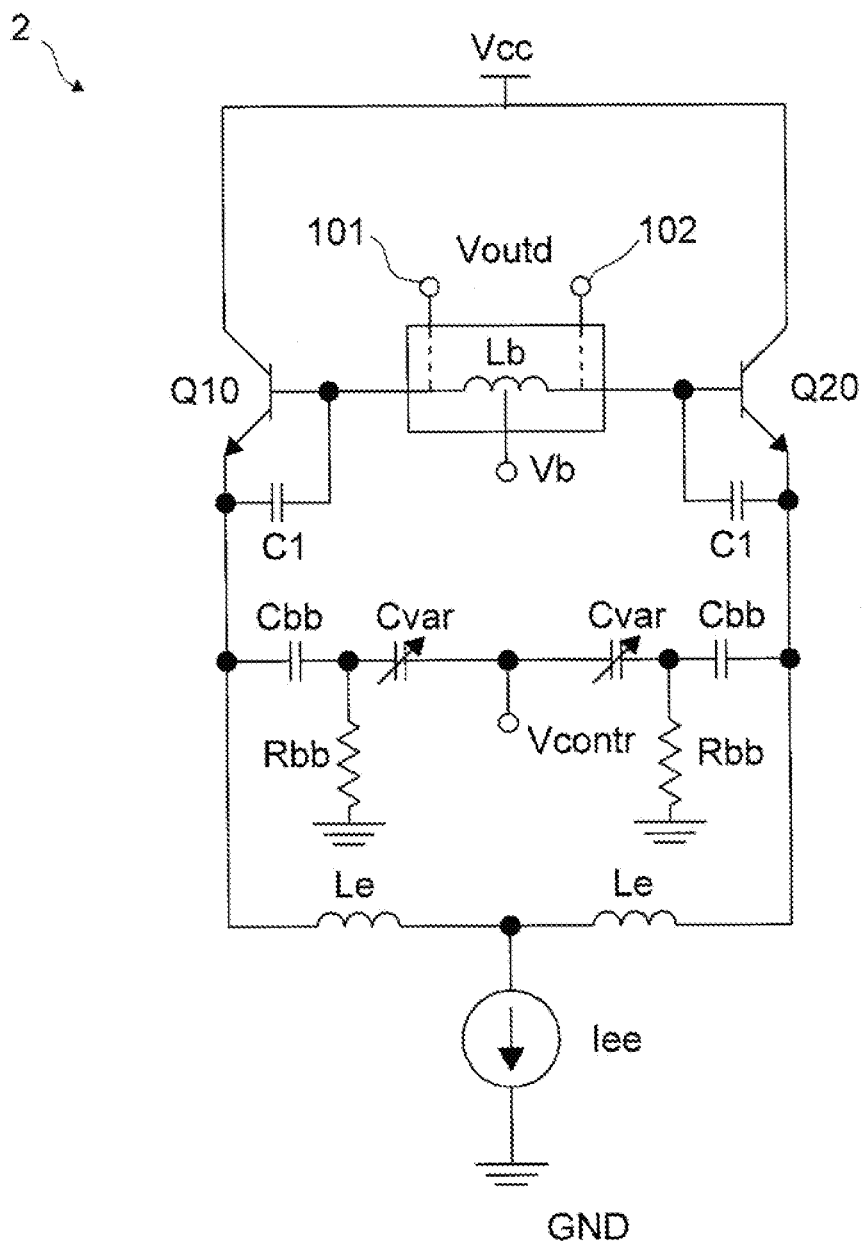
FIG. 5 is a circuit diagram of an oscillator in accordance with a second embodiment of the present disclosure.

FIG. 5 shows an oscillator 2 in accordance with a second embodiment of the present disclosure; the oscillator 2 has a differential structure based on a Colpitts circuit. Oscillator 2 comprises first and second transistors Q10, Q20; both the transistors may be bipolar (preferably npn bipolar transistors) or MOS transistors (preferably NMOS transistors). The first terminals of the transistors Q10 and Q20, i.e., the collector terminals in the case of bipolar transistor or the drain terminals in the case of MOS transistor, are common and connected to the power supply voltage Vcc. The oscillator 2 comprises at least one inductive element Lb connected between the second terminals of the transistor Q10 and Q20, i.e., the base terminals in the case of bipolar transistor or the gate terminal in the case of MOS transistor, and preferably to a bias voltage Vb and at least one capacitive element Cvar coupled between the third terminals of the transistors Q10 and Q20, i.e., the emitter terminals in the case of bipolar transistor or the source terminals in the case of MOS transistor, and ground GND. The third terminals are preferably connected in parallel to a series of two variable capacitors Cvar and a series of two inductors Le; the common terminal of the two inductors is connected to a reference current Iee while a voltage Vcontr is applied to the common terminal of the two variable capacitors Cvar. A network is preferably provided that includes a capacitance Cbb and a resistance Rbb and arranged between each third terminal and ground GND for biasing the variable capacitances Cvar between the ground GND and the control voltage Vcontr.

Each of the transistors Q10 and Q20 has a capacitive element C1 arranged between the second and third terminals; said capacitive element may consist of the sole parasitic capacitance intrinsically present between the second and third terminals of the transistors Q10 and Q20, i.e., the base-emitter capacitance in the case of bipolar transistor or the gate-source capacitance in the case of MOS transistor, or in the set of said parasitic capacitance and another external capacitance.

Oscillator 2 comprises two terminals 101 and 102 for collecting the output signal Voutd of said oscillator, i.e., the differential output signal; said two terminals 101 and 102 are directly connected to the second terminals of the transistors Q10 and Q20, respectively. Thereby, the load impedance on the first terminals and/or the use of current buffers are eliminated and therefore both the dynamics limitations and the Miller effect of the capacitance $C_\mu$, of the transistors are avoided, which is deleterious for the tuning range performances and for starting up the oscillator.

Oscillator 2 in FIG. 5 is of the millimeter wave type, i.e., both the inductive element Lb and the capacitive elements Cvar are sized so that the oscillation frequency is between 30 and 300 gigahertz. In the case of a transistor operating at millimeter wave frequencies, the current gain between the first terminal and the second terminal under conditions of oscillation is usually less than one.

In the embodiment of the disclosure shown in FIG. 5, the inductive element Lb particularly has a central socket to which the bias voltage Vb is connected.

Figure 6:
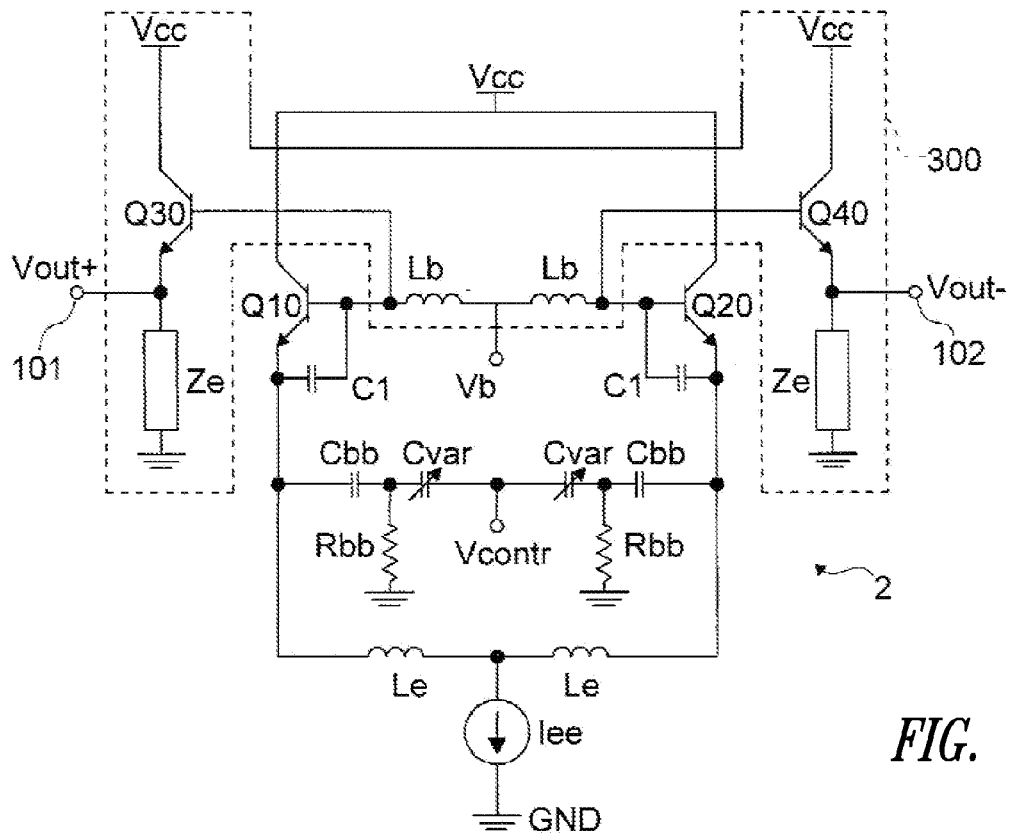
FIG. 6 is a circuit diagram of an oscillator in accordance with a variant of the second embodiment of the present disclosure.

With reference to FIG. 6, a voltage-controlled oscillator is shown according to a variant of the second embodiment of the present disclosure. The oscillator in FIG. 6 differs from the oscillator in FIG. 5 due to the presence of two inductive elements Lb, the common terminal of which is connected to the bias voltage Vb. The voltage signal at the ends of the two inductive elements Lb and on the second terminals of the transistors Q10 and Q20 is collected by a stage 300 comprising a pair of transistors Q30 and Q40, of MOS type or of bipolar type. The transistors Q30 and Q40 are of the common collector or common drain type and have impedance Ze connected between the emitter or source terminal and ground GND; the base or gate terminals of the transistors Q30 and Q40 are connected to the second terminals of the transistors Q10 and Q20. The output signal Voutd is the difference between the Vout− and Vout+ signals on the terminals 101 and 102 connected to the emitter or source terminals of the transistors Q30 and Q40.

Figure 7:
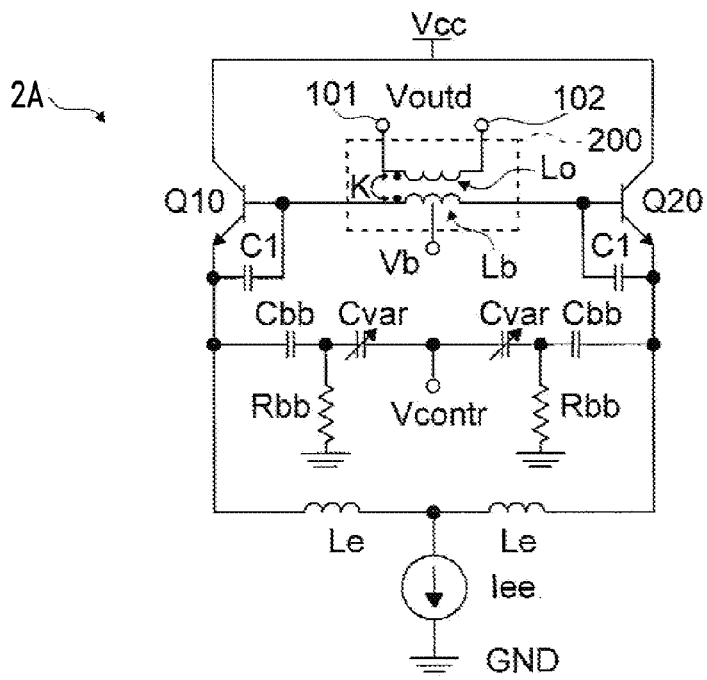
FIG. 7 is a circuit diagram of an oscillator in accordance with a further variant of the second embodiment of the present disclosure.

With reference to FIG. 7 a voltage-controlled oscillator 2A is shown in accordance with a further variant of the second embodiment of the present disclosure. The oscillator 2A in FIG. 7 differs from the oscillator 2 in FIG. 5 due to the presence of a transformer 200 comprising the inductive element Lb having a central socket; the integrated transformer 200 has a voltage ratio K and serves both the function of inductive element of the resonator of oscillator 2 and of coupling the output signal from the oscillator with the circuits downstream. Transformer 200 comprises a primary inductor Lb arranged between the second terminals of the transistors Q10 and Q20 and a secondary inductor Lo; the voltage signal Voutd is collected between the terminals 101 and 102 of the secondary inductor Lo.

There are several advantages of a voltage-controlled oscillator in accordance with the aforesaid embodiments of the disclosure. The configuration with the collector or drain terminals placed at the power supply voltage Vcc eliminates the amplification of the $C_\mu$ due to the Miller effect. This results in a reduction of the parasitic capacitive element parallel with the inductor on the base or gate terminal, with a significant benefit on the tuning range performances. Indeed, the start-up condition of the oscillator is improved thus increasing the negative impedance.

Moreover, the collector or drain terminals being placed at the power supply voltage Vcc allows the dynamics of the oscillation signal to be increased. In this case the voltage signal $v_{b,max}$ whereby the transistors Q10 and Q20 are still in the active area, is $v_{b,max} < Vcc - Vb + Vbe - Vce,sat$ where Vbe is the base-emitter voltage or the gate-source voltage of each transistor Q10, Q20 and Vce,sat is the collector-emitter or drain-source saturation voltage of each transistor Q10, Q20. The term $v_{c,min}$, is absent as compared to the previous expression for circuits of known art, therefore $v_{b,max}$ increases by a quantity equal and opposite to $v_{c,min}$. Similarly, it may be asserted that there is an increase of the signal amplitude which determines the operating threshold of the oscillator in active area. When needed, the increase of the non-saturated dynamics of the transistor allows a greater oscillation amplitude, with a possible improved phase noise.

Furthermore, the superior performances in terms of tuning range of the solution in accordance with the disclosure may be exploited to reduce the consumption of current, by using higher inductance values Lb.

In the case of the oscillator in FIG. 6, the embodiment of the oscillation signal coupling by means of stages in a configuration having a common collector or drain minimizes the load effect on the oscillator resonator, thus preserving the tuning stage. Moreover, using stages having common, conveniently sized collector or drain does not introduce any limitation on the amplitude of the oscillation signal.

In the case of the oscillator in FIG. 7, the embodiment of the oscillation signal coupling by means of an integrated transformer avoids coupling capacitances in alternating current towards the successive stage from being used. As a result, there is a benefit not only in terms of less silicon area, but also in terms of reduction of the interconnecting parasitic elements between the circuit blocks, which represents a significant benefit while operating in the range of the millimeter waves. Moreover, using the transformer avoids stages with active components which dissipate power from being employed.

Figure 8:
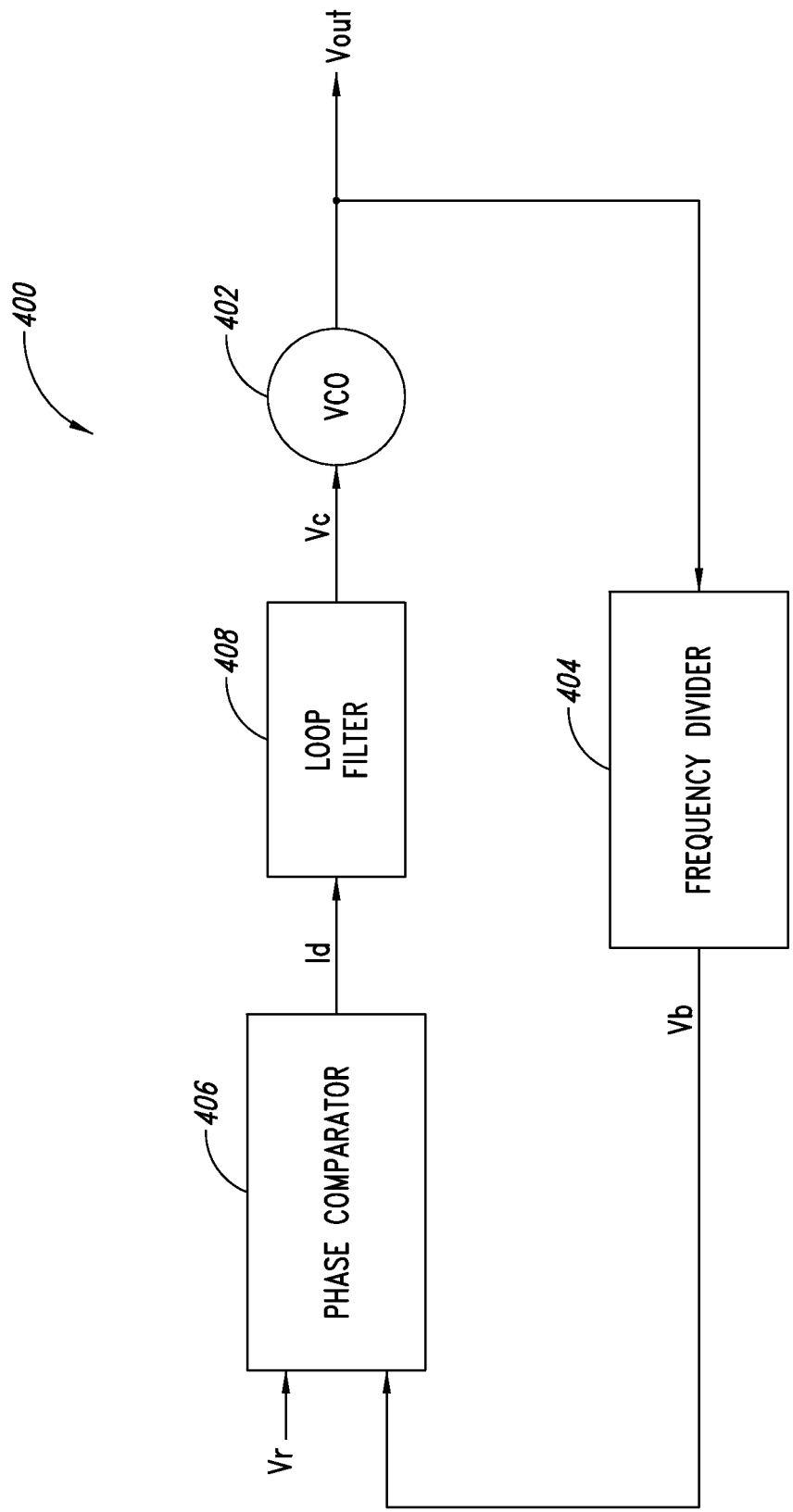
FIG. 8 is a block diagram of a phase-lock loop according to one embodiment of the present disclosure.

A block diagram of a phase-lock loop (PLL) 400, which includes a VCO 402, according to one embodiment of the disclosure is shown in FIG. 8. The VCO 402 can be implemented with any VCO according to the present disclosure, such as the VCOs shown in FIGS. 4-7. The PLL 400 can be used to synthesize an output signal Vout with a desired frequency Fo (defining a channel of operation of the PLL 400). The output signal Vout is obtained by multiplying a frequency Fr of a reference signal Vr by a selected conversion factor. The reference signal Vr can be generated by a quartz oscillator (not shown in the figure), which provides a stable and accurate time base.

The PLL 400 includes a feedback loop having a frequency divider 404 that receives the output signal Vout. The frequency divider 404 divides the frequency Fo of the output signal Vout by a divider value N. The resulting signal Vb (having a frequency Fb) is fed back to a phase comparator 406.

The phase comparator 406 compares the feedback signal Vb with the reference signal Vr. The phase comparator 406 outputs a control current Id indicative of the phase difference between the two signals. The current Id is injected into a loop filter 408 which removes the high frequency components of the control current Id. In addition, the loop filter integrates the control current Id into a corresponding voltage Vc. The control voltage Vc controls the variable capacitor(s) Cvar of the VCO 402, which provides the output signal Vout.

In an unlock condition (such as during an initial power up or immediately after a channel switching), the frequency Fb of the feedback signal Vb is different from the frequency Fr of the reference signal Vr. Therefore, the phase comparator 406 outputs a corresponding control current Id. The resulting control voltage Vc (from the loop filter 408) changes the frequency Fo of the output signal Vout accordingly. Particularly, when the feedback frequency Fb is lower than the reference frequency Fr, the control voltage Vc instructs the VCO 402 to increase the output frequency Fo; conversely, when the feedback frequency Fb is higher than the reference frequency Fr, the control voltage Vc instructs the VCO 402 to reduce the output frequency Fo.

After a transient period, the frequency Fb of the feedback signal Vb reaches the frequency Fr of the reference signal Vr (with Vc=0). In this lock condition, the frequency Fo of the output signal Vout is thus equal to Fr*N. Therefore, the PLL 400 delivers an output signal Vout with a frequency Fo having any desired value that is a multiple of the frequency Fr of the reference signal Vr (according to N). In other words, the output frequency Fo can be adjusted (across a band of interest) with a resolution, or channel spacing, equal to the reference frequency Fr.

Figure 9:
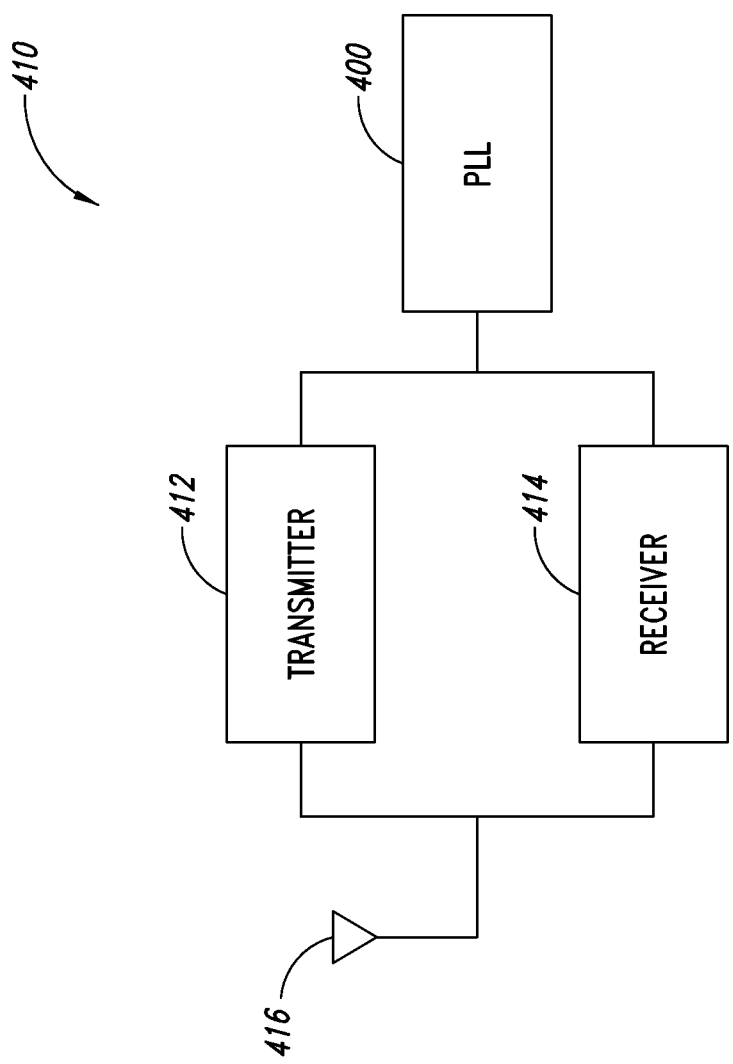
FIG. 9 is block diagram of a radio communication apparatus according to one embodiment of the present disclosure.

The VCO and phase locked loop in accordance with the disclosure may be employed in a radio communication apparatus, such as a mobile telephone. A block diagram of such a radio communication apparatus 410 according to one embodiment is shown in FIG. 9. The a radio communication apparatus 410 includes a transmitter 412 and a receiver 414 coupled in parallel between an antenna 414 and the a phase locked loop 400

The various embodiments described above can be combined to provide further embodiments. All of the U.S. patents, U.S. patent application publications, U.S. patent application, foreign patents, foreign patent application and non-patent publications referred to in this specification are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An oscillator comprising:
a power supply voltage terminal;
a bias voltage terminal;
a ground terminal;
a first transistor having a control terminal and first and second conduction terminals, the first conduction terminal being coupled to the power supply voltage terminal;
a first inductive element coupled between the control terminal of the transistor and the bias voltage terminal;
a first capacitive element coupled between the second conduction terminal of the transistor and the ground terminal;
output means for collecting an output signal of said oscillator from the control terminal of the transistor.

2. An oscillator according to claim 1, said capacitive element is a variable capacitor configured to be controlled by an external voltage signal.

3. An oscillator according to claim 1, further comprising:
a second transistor coupled to the first transistor in a differential structure, the second transistor having a control terminal and first and second conduction terminals, the first conduction terminal of the second transistor being coupled to said power supply voltage terminal; and
a second capacitive element coupled between the second conduction terminal of the second transistor and the ground terminal, wherein:
the inductive element is arranged between the control terminals of the first and second transistors; and
the output means are for collecting a differential output signal of said oscillator from the control terminals of the first and second transistors.

4. An oscillator according to claim 3, wherein said first inductor is a central socket inductor having a central socket configured to be coupled to said bias voltage.

5. An oscillator according to claim 3, comprising a second inductor coupled between the first inductor and the control terminal of the second transistor, the bias voltage terminal being a common terminal at which said first and second inductors are connected.

6. An oscillator according to claim 3, wherein the output means comprise:
a pair of third and fourth transistors having respective first conduction terminals coupled to said power supply voltage terminal, respective control terminals coupled respectively to the control terminals of the first and second transistors, and respective second conductive terminals coupled to the ground terminal;

first and second impedances respectively coupled between the ground terminal and the second conduction terminals of the third and fourth transistors; and differential output terminals respectively coupled to the second conduction terminals of the third and fourth transistors and configured to provide the differential output signal of the oscillator.

7. An oscillator according to claim 3, comprising:
a first resistor coupled between the first capacitive element and the ground reference terminal;
a second resistor coupled between the second capacitive element and the ground reference terminal;
a control voltage terminal;
a first variable capacitance coupled between the control voltage terminal and a first node coupling the first resistor to the first capacitive element; and
a second variable capacitance coupled between the control voltage terminal and a second node coupling the second resistor to the second capacitive element.

8. An oscillator according to claim 1, wherein the first inductor is a primary inductor of a transformer arranged between the control terminals of the first and second transistors, said primary inductor being a central socket inductor having a central socket coupled to said bias voltage, said output means including a secondary inductor of the transformer, the secondary inductor having terminals configured to provide the output signal of the oscillator.

9. An oscillator according to claim 1, wherein said first capacitive element and said first inductive element are sized to provide an oscillation frequency of the oscillator between 30 and 300 gigahertz.

10. An oscillator according to claim 1, wherein said first transistor is a bipolar transistor, said first conduction terminal is a collector terminal, said control terminal is a base terminal, and said second terminal is an emitter terminal of the bipolar transistor.

11. A phase-lock loop, comprising:
a phase detector having an input and an output; and
an oscillator having an input coupled to the output of the phase detector and output feedback coupled to the input of the phase detector, the oscillator including:
a power supply voltage terminal;
a bias voltage terminal;
a ground terminal;
a first transistor having a control terminal and first and second conduction terminals, the first conduction terminal being coupled to the power supply voltage terminal;
a first inductive element coupled between the control terminal of the transistor and the bias voltage terminal;
a first capacitive element coupled between the second conduction terminal of the transistor and the ground terminal;
output means for collecting an output signal of said oscillator from the control terminal of the transistor.

12. A phase-lock loop according to claim 11, wherein the oscillator includes:
a second transistor coupled to the first transistor in a differential structure, the second transistor having a control terminal and first and second conduction terminals, the first conduction terminal of the second transistor being coupled to said power supply voltage terminal; and
a second capacitive element coupled between the second conduction terminal of the second transistor and the ground terminal, wherein:
the inductive element is arranged between the control terminals of the first and second transistors; and
the output means are for collecting a differential output signal of said oscillator from the control terminals of the first and second transistors.

13. A phase-lock loop according to claim 12, comprising a second inductor coupled between the first inductor and the control terminal of the second transistor, the bias voltage terminal being a common terminal at which said first and second inductors are connected.

14. A phase-lock loop according to claim 12, wherein the output means comprise:
a pair of third and fourth transistors having respective first conduction terminals coupled to said power supply voltage terminal, respective control terminals coupled respectively to the control terminals of the first and second transistors, and respective second conductive terminals coupled to the ground terminal;
first and second impedances respectively coupled between the ground terminal and the second conduction terminals of the third and fourth transistors; and
differential output terminals respectively coupled to the second conduction terminals of the third and fourth transistors and configured to provide the differential output signal of the oscillator.

15. A phase-lock loop according to claim 11, wherein the first inductor is a primary inductor of a transformer arranged between the control terminals of the first and second transistors, said primary inductor being a central socket inductor having a central socket coupled to said bias voltage, said output means including a secondary inductor of the transformer, the secondary inductor having terminals configured to provide the output signal of the oscillator.

16. A radio communication apparatus, comprising:
a receiver; and
a phase-lock loop coupled to the receiver, the phase-lock loop including:
a phase detector having an input and an output; and
an oscillator having an input coupled to the output of the phase detector and output feedback coupled to the input of the phase detector, the oscillator including:
a power supply voltage terminal;
a bias voltage terminal;
a ground terminal;
a first transistor having a control terminal and first and second conduction terminals, the first conduction terminal being coupled to the power supply voltage terminal;
a first inductive element coupled between the control terminal of the transistor and the bias voltage terminal;
a first capacitive element coupled between the second conduction terminal of the transistor and the ground terminal;
output means for collecting an output signal of said oscillator from the control terminal of the transistor.

17. A radio communication apparatus according to claim 16, wherein the oscillator includes:
a second transistor coupled to the first transistor in a differential structure, the second transistor having a control terminal and first and second conduction terminals, the first conduction terminal of the second transistor being coupled to said power supply voltage terminal; and
a second capacitive element coupled between the second conduction terminal of the second transistor and the ground terminal, wherein:

the inductive element is arranged between the control terminals of the first and second transistors; and the output means are for collecting a differential output signal of said oscillator from the control terminals of the first and second transistors.

18. A radio communication apparatus according to claim 17, comprising a second inductor coupled between the first inductor and the control terminal of the second transistor, the bias voltage terminal being a common terminal at which said first and second inductors are connected.

19. A radio communication apparatus according to claim 17, wherein the output means comprise:

a pair of third and fourth transistors having respective first conduction terminals coupled to said power supply voltage terminal, respective control terminals coupled respectively to the control terminals of the first and second transistors, and respective second conductive terminals coupled to the ground terminal;

first and second impedances respectively coupled between the ground terminal and the second conduction terminals of the third and fourth transistors; and differential output terminals respectively coupled to the second conduction terminals of the third and fourth transistors and configured to provide a differential output signal of the oscillator.

20. A radio communication apparatus according to claim 16, wherein the first inductor is a primary inductor of a transformer arranged between the control terminals of the first and second transistors, said primary inductor being a central socket inductor having a central socket coupled to said bias voltage, said output means including a secondary inductor of the transformer, the secondary inductor having terminals configured to provide the output signal of the oscillator.

* * * * *